(12) United States Patent
Osuga et al.

(10) Patent No.: US 10,347,620 B2
(45) Date of Patent: Jul. 9, 2019

(54) SEMICONDUCTOR DEVICE

(71) Applicant: ABLIC Inc., Chiba-shi, Chiba (JP)

(72) Inventors: Yuki Osuga, Chiba (JP); Hirofumi Harada, Chiba (JP); Mio Mukasa, Chiba (JP)

(73) Assignee: ABLIC INC., Chiba (JP)

( * ) Notice: Subject to any disclaimer, the term of this patent is extended or adjusted under 35 U.S.C. 154(b) by 0 days.

(21) Appl. No.: 16/050,888

(22) Filed: Jul. 31, 2018

(65) Prior Publication Data

US 2019/0043853 A1 Feb. 7, 2019

(30) Foreign Application Priority Data

Aug. 4, 2017 (JP) .................................. 2017-151416

(51) Int. Cl.
| | |
|---|---|
| *H01L 27/02* | (2006.01) |
| *H01L 29/78* | (2006.01) |
| *H01L 29/66* | (2006.01) |
| *H01L 29/423* | (2006.01) |
| *H01L 29/861* | (2006.01) |
| *H01L 29/49* | (2006.01) |

(52) U.S. Cl.
CPC .... *H01L 27/0255* (2013.01); *H01L 29/42336* (2013.01); *H01L 29/66712* (2013.01); *H01L 29/66734* (2013.01); *H01L 29/7804* (2013.01); *H01L 29/7813* (2013.01); *H01L 29/861* (2013.01); *H01L 29/4983* (2013.01)

(58) Field of Classification Search
None
See application file for complete search history.

(56) References Cited

U.S. PATENT DOCUMENTS

| | | | |
|---|---|---|---|
| 6,965,150 B2 | 11/2005 | Higashida et al. | |
| 9,202,907 B2* | 12/2015 | Fujita | ................... H01L 27/0248 |
| 2013/0082285 A1* | 4/2013 | Kudou | ................ H01L 29/0619 257/77 |
| 2018/0350973 A1* | 12/2018 | Mori | ........................ H01L 29/78 |

FOREIGN PATENT DOCUMENTS

| | | |
|---|---|---|
| JP | 3298476 | 7/2002 |
| JP | 5391261 | 1/2014 |

* cited by examiner

*Primary Examiner* — Michelle Mandala
(74) *Attorney, Agent, or Firm* — Brinks Gilson & Lione

(57) ABSTRACT

Provided is a semiconductor device having an ESD protection diode and a vertical MOSFET in which desired ESD tolerance is obtained without reducing the active region size or increasing the chip size. The semiconductor device includes: a substrate; a drain region and a source region in the substrate; a base region between the drain region and the source region; a gate electrode comprising a first polysilicon layer, and being in contact with the base region across a gate insulating film so that a channel is formed in the base region; and a bidirectional diode in which the gate electrode, a second polysilicon layer, and a third polysilicon layer are arranged in the stated order in a direction perpendicular to a front surface of the substrate.

8 Claims, 13 Drawing Sheets

SEMICONDUCTOR DEVICE

RELATED APPLICATIONS

This application claims priority under 35 U.S.C. § 119 to Japanese Patent Application No. 2017-151416 filed on Aug. 4, 2017, the entire content of which is hereby incorporated by reference.

BACKGROUND OF THE INVENTION

1. Field of the Invention

The present invention relates to a semiconductor device, and more particularly, to a semiconductor device having a vertical MOSFET and a bidirectional diode (ESD protection diode) which is configured to protect a gate insulating film of the vertical MOSFET against electrostatic discharge (hereinafter abbreviated as ESD).

2. Description of the Related Art

A conventional semiconductor device having a vertical MOSFET and an ESD protection diode is described with reference to FIG. 13A and FIG. 13B.

FIG. 13A is a plan view of a conventional semiconductor device 900. FIG. 13B is a sectional view taken along the line a-a' of FIG. 13A.

As illustrated in FIG. 13B, the semiconductor device 900 includes an active region A in which a vertical MOSFET 901 with a planar gate is formed, and a field region B in which a thick field oxide film 918 is formed on a front surface of a substrate 916 constructed from a heavily-doped semiconductor substrate 910 and an epitaxial layer 915.

A bidirectional diode 925 is formed on the field oxide film 918 in the field region B as an ESD protection diode which protects a gate insulating film 921 of the vertical MOSFET 901 against ESD. The bidirectional diode 925 is constructed by connecting in series a P-type polysilicon layer $923_1$, an N-type polysilicon layer $924_1$, a P-type polysilicon layer $923_2$, an N-type polysilicon layer $924_2$, and a P-type polysilicon layer $923_3$ all of which are aligned in a direction parallel to the surface of the substrate 916.

The vertical MOSFET 901 formed in the active region A includes a drain region 917 constructed from the heavily-doped semiconductor substrate 910 and a semiconductor layer 911, a base region 912, a source region 913, a base contact region 914, a gate insulating film 921, and a gate electrode 922.

An interlayer insulating film 926 is formed on the vertical MOSFET 901 and the bidirectional diode 925. Contact holes are formed in the interlayer insulating film 926 to expose surfaces of the source region 913 and the base contact region 914 in the vertical MOSFET 901, and a surface of the P-type polysilicon layer $923_1$ and a surface of the P-type polysilicon layer $923_3$ in the bidirectional diode 925 respectively.

A source electrode 931 is formed on the interlayer insulating film 926 so as to extend from the active region A to the field region B. The source electrode 931 electrically connects the source region 913 and the base contact region 914 with the P-type polysilicon layer $923_1$ of the bidirectional diode 925 via the contact holes formed in the interlayer insulating film 926. A gate pad 933 is formed above the field region B and is electrically connected to the P-type polysilicon layer $923_3$ of the bidirectional diode 925 via one of the contact holes formed in the interlayer insulating film 926. The gate electrode 922 is electrically connected to the gate pad 933 in a region not shown in FIG. 13A and FIG. 13B. A drain electrode 932 is formed on a back surface of the substrate 916 in contact with the heavily-doped semiconductor substrate 910.

Japanese Patent No. 3298476, for example, discloses a semiconductor device having a similar configuration.

The "base region" and "base contact region" described above are sometimes called "body region" and "body contact region" or other terms, but the terms "base region" and "base contact region" are used herein.

As described above, a bidirectional diode is formed in the field region in a conventional semiconductor device having a vertical MOSFET and an ESD protection diode (bidirectional diode) as in Japanese Patent No. 3298476.

A P-N junction of the bidirectional diode should be large in area in order to improve the ESD tolerance. Accordingly, a large-size bidirectional diode should be formed in the field region in order to secure desired ESD tolerance, and should be accommodated by reducing the active region in size or increasing the chip size, resulting in an obstacle to chip size reduction.

SUMMARY OF THE INVENTION

It is an object of the present invention to provide a semiconductor device having a vertical MOSFET and a bidirectional diode in which desired ESD tolerance is obtained without reducing an active region in size or increasing the chip size in order to form a bidirectional diode as an ESD protection diode.

In one embodiment of the present invention, there is provided a semiconductor device including: a substrate; a drain region and a source region of a first conductivity type in the substrate; a base region of a second conductivity type between the drain region and the source region; a gate electrode comprising a first polysilicon layer of the first conductivity type, and being in contact with the base region across a gate insulating film therebetween; a bidirectional diode including the gate electrode, a second polysilicon layer of the second conductivity type on the gate electrode, and a third polysilicon layer of the first conductivity type on the second polysilicon layer, and being configured so that the gate electrode serves as one end, the gate electrode, the second polysilicon layer, and the third polysilicon layer being arranged in the stated order in a direction perpendicular to a front surface of the substrate; a source electrode electrically connected to the source region, the base region, and another end of the bidirectional diode; and a drain electrode formed on a back surface of the substrate in contact with the drain region.

According to the present invention, the gate electrode, the second polysilicon layer, and the third polysilicon layer which form the bidirectional diode are laminated in the stated order in a direction perpendicular to the surface of the substrate. The alignment of P-type polysilicon and N-type polysilicon from which a bidirectional diode is made in a direction horizontal to a substrate in a field region as in the conventional art is eliminated. The field region can be reduced in size accordingly. One of the active region expansion and the chip size reduction is thus accomplished.

In addition, the P-N junction area of the bidirectional diode can be substantially equal to the area of a upper surface of the gate electrode. The large P-N junction area gives high ESD tolerance.

BRIEF DESCRIPTION OF THE DRAWINGS

Embodiments of the invention will now be described, by way of example, with reference to the accompanying drawings, in which.

DETAILED DESCRIPTION OF THE PREFERRED EMBODIMENTS

The invention will be now described herein with reference to illustrative embodiments.

Figure 1:
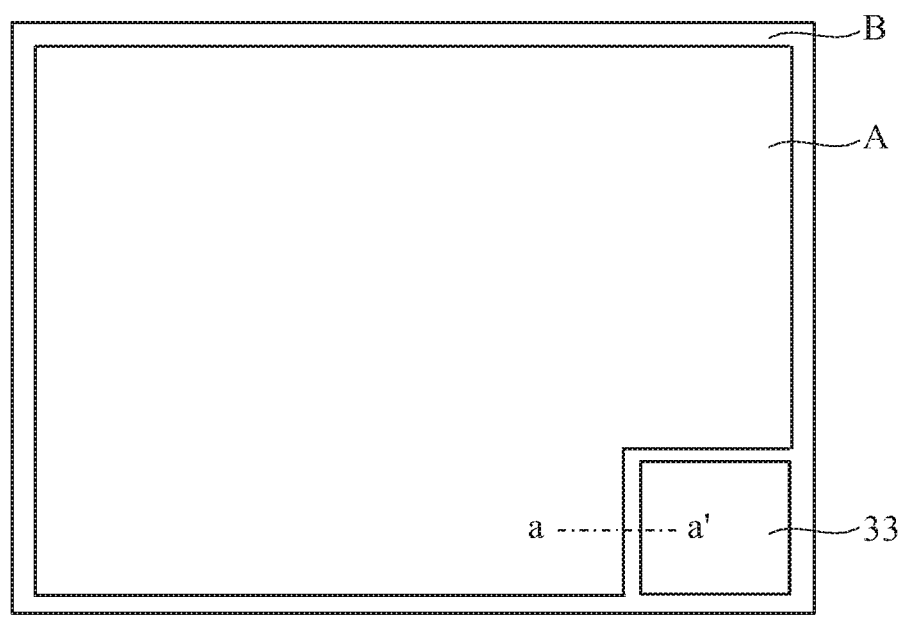
FIG. 1 is a plan view for illustrating a semiconductor device according to one embodiment of the present invention.

FIG. 1 is a plan view for illustrating a semiconductor device having a vertical MOSFET according to one embodiment of the present invention. This plan view is common to all semiconductor devices according to the first embodiment to a seventh embodiment which are described below.

As illustrated in FIG. 1, each of the semiconductor devices according to the embodiments of the present invention includes an active region A and a field region B, and a vertical MOSFET (not shown) is provided in the active region A while a gate pad 33 is provided in the field region B.

Figure 2:
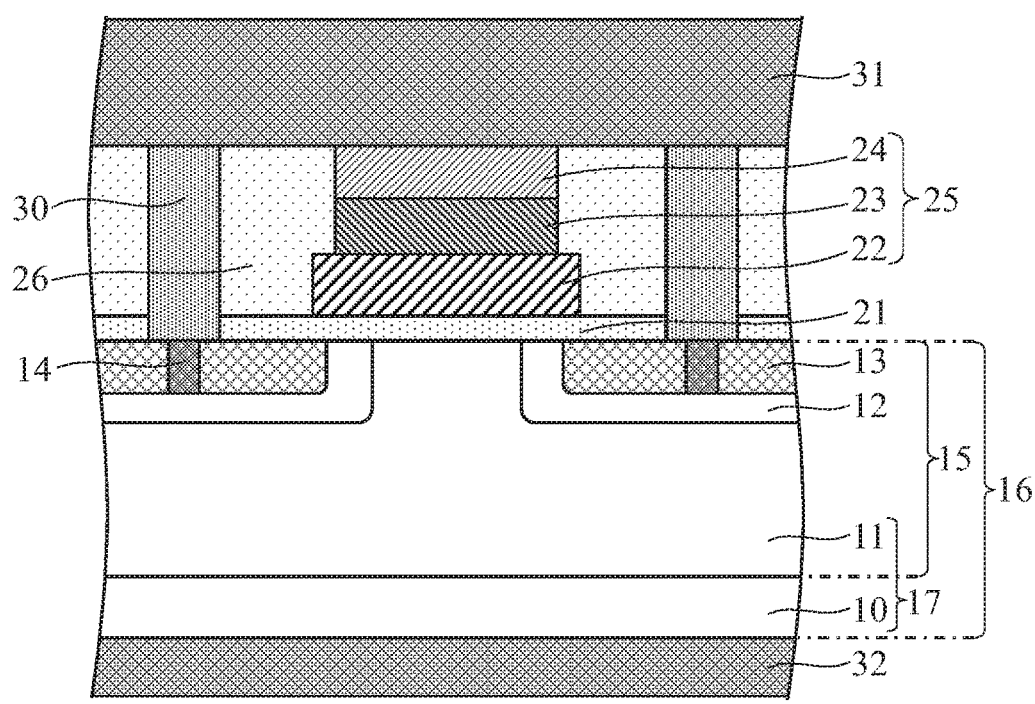
FIG. 2 is a sectional view for illustrating the structure of a vertical MOSFET in a semiconductor device according to a first embodiment of the present invention.

FIG. 2 is a sectional view for illustrating the structure of a vertical MOSFET 100 in the semiconductor device according to the first embodiment of the present invention. The vertical MOSFET 100 illustrated in FIG. 2 is formed in the active region A of FIG. 1.

As illustrated in FIG. 2, the vertical MOSFET 100 has a planar gate and includes a heavily-doped semiconductor substrate 10 which is heavily doped with N-type impurities, and an epitaxial layer 15 which is formed on the heavily-doped semiconductor substrate 10. In the following description, the heavily-doped semiconductor substrate 10 and the epitaxial layer 15 are also collectively referred to as a substrate 16.

A drain region 17, a P-type base region 12, an N-type source region 13, and a base contact region 14 are formed in the substrate 16. The drain region 17 includes the N-type heavily-doped semiconductor substrate 10 and an N-type semiconductor layer 11 which is formed on the N-type heavily-doped semiconductor substrate 10. The P-type base region 12 is formed in a front surface of the substrate 16 (the epitaxial layer 15). The N-type source region 13 is formed in the front surface of the substrate 16 inside the base region 12. The base contact region 14 is provided from the front surface of the substrate 16 and is laterally sandwiched by portions of the source region 13, and reaches the base region 12.

A gate electrode 22 of N-type polysilicon is formed above the substrate 16 on a gate insulating film 21 therebetween so that a channel is formed along a portion of the base region 12 that is in the front surface of the substrate 16. A P-type polysilicon layer 23 and an N-type polysilicon layer 24 are laminated on the gate electrode 22. The three layers, the gate electrode 22, the P-type polysilicon layer 23, and the N-type polysilicon layer 24, form a bidirectional diode 25 in which the gate electrode 22 serves as one end and the N-type polysilicon layer 24 serves as the other end.

The P-type polysilicon layer 23 and the N-type polysilicon layer 24 are narrower in width than the gate electrode 22 as illustrated in FIG. 2 due to the manufacturing method described later, and the P-type polysilicon layer 23 and the N-type polysilicon layer 24 are not necessarily narrower than the width of gate electrode 22. Preferably, the P-type polysilicon layer 23 and the N-type polysilicon layer 24 have a width as close to the gate electrode width as possible.

An interlayer insulating film 26 is formed on regions above the substrate 16, excluding a region of the bidirectional diode 25, to the height level with a surface of the N-type polysilicon layer 24 which is the other end of the bidirectional diode 25. A source electrode 31 is formed on the bidirectional diode 25 and the interlayer insulating film 26. The source electrode 31 is in direct contact with the N-type polysilicon layer 24 which is the other end of the bidirectional diode 25, and is also electrically connected to the source region 13 and the base contact region 14 via a contact plug 30 which is formed in the interlayer insulating film 26. A drain electrode 32 is formed on the entire back surface of the substrate 16 in contact with the heavily-doped semiconductor substrate 10.

Figure 3:
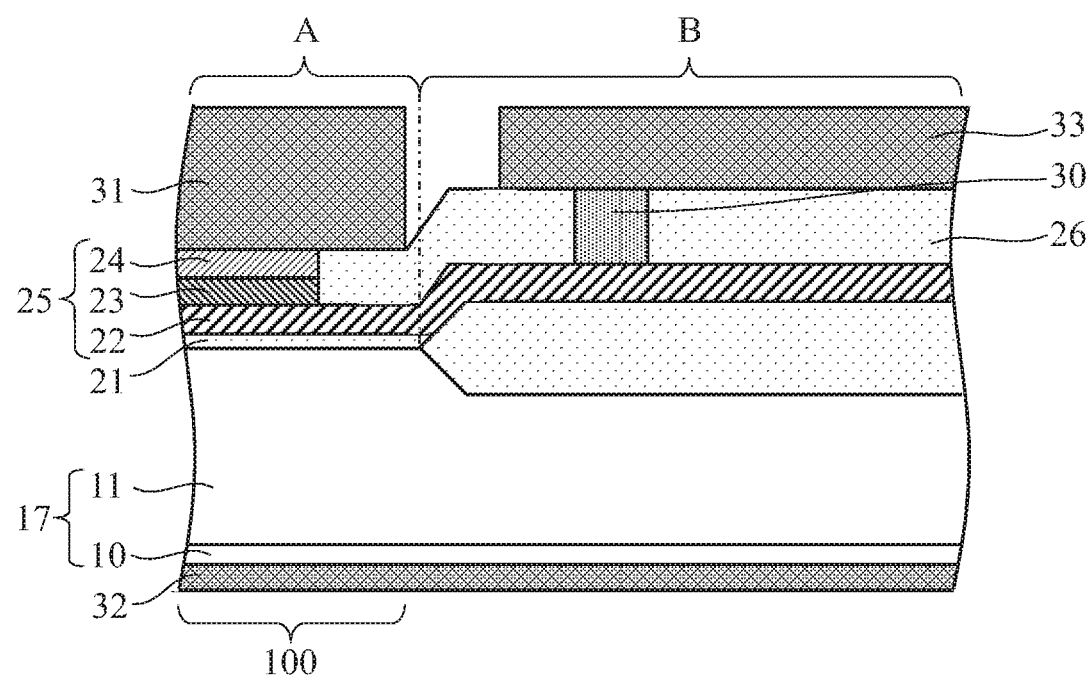
FIG. 3 is a sectional view for illustrating the structures of the vertical MOSFET and a gate pad portion in the semiconductor device according to the first embodiment of the present invention.

FIG. 3 is a sectional view taken along the line a-a' of FIG. 1. In FIG. 3, the structures of the vertical MOSFET 100 and a gate pad portion in the semiconductor device according to the first embodiment are illustrated.

As illustrated in FIG. 3, a part of the gate electrode 22 is formed to extend from the active region A to the field region B, and is electrically connected to the gate pad 33 in the field region B via the contact plug 30 which is formed in the interlayer insulating film 26 on the gate electrode 22.

The vertical MOSFET 100 of the semiconductor device according to the first embodiment is thus configured so that the gate electrode 22, the P-type polysilicon layer 23, and the N-type polysilicon layer 24 which construct the bidirectional diode 25 as the first polysilicon layer, the second polysilicon layer, and the third polysilicon layer, respectively, are formed in the stated order in a direction perpendicular to the substrate 16, thereby eliminating the alignment of the bidirectional diode 25 in the horizontal direction in the field region B as in the conventional art. Correspondingly, one of the chip size reduction and the active region expansion is thus possible.

In addition, a plurality of gate electrodes are formed in parallel in the active region illustrated in FIG. 1, each extending in a direction perpendicular to the plane of the paper of FIG. 2, and each gate electrode, the P-type polysilicon layer 23, and the N-type polysilicon layer 24 are substantially equal to one another in width which gives a P-N junction of the bidirectional diode an area substantially equal to the area of the upper surface of the gate electrode. Accordingly increase in the area of the P-N junction of the bidirectional diode 25 without the chip size expansion can thus enhances the ESD tolerance.

Furthermore, since the gate electrode 22 is used as a component of the bidirectional diode 25, the bidirectional diode 25 is benefited by one layer.

An example of a method of manufacturing the vertical MOSFET 100 in the semiconductor device according to the first embodiment is described next with reference to sectional views of FIG. 4, FIG. 5A, and FIG. 5B for manufacturing steps.

Figure 4:
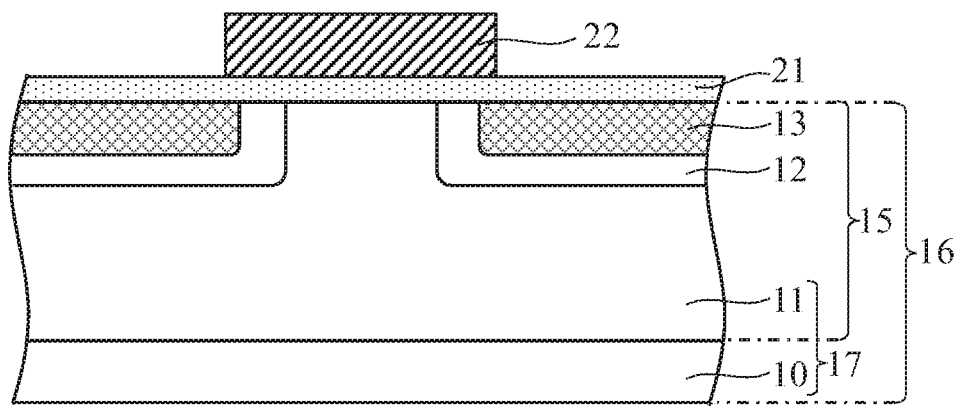
FIG. 4 is a sectional view for illustrating a method of manufacturing the vertical MOSFET in the semiconductor device according to the first embodiment of the present invention.

As illustrated in FIG. 4, an epitaxial layer 15 doped with an N-type impurity is formed by epitaxial growth on the heavily-doped semiconductor substrate 10 with an N-type impurity. The substrate 16 constructed from the heavily-doped semiconductor substrate 10 and the epitaxial layer 15 is formed in this manner. The gate insulating film 21 is then formed by thermal oxidation or other methods on the front surface of the substrate 16. An N-type polysilicon layer is formed on the gate insulating film 21, and then a photoresist pattern (not shown) covering a region in which the gate electrode 22 remains is formed by photolithography. The photoresist pattern is subsequently used as a mask in the etching of the N-type polysilicon layer to form the gate electrode 22.

Next, the gate electrode 22 is used as a mask in the doping of a P-type impurity to form the P-type base region 12 by the thermal diffusion of the P-type impurity from the front surface of the substrate 16 (the epitaxial layer 15). The N-type drain region 17 is thereby formed from the N-type semiconductor layer 11 which is the remainder of the epitaxial layer and the heavily-doped semiconductor substrate 10. The substrate 16 is then doped from its front surface with an N-type impurity by using the gate electrode 22 as a mask to form the N-type source region 13 inside the P-type base region 12.

Figure 5A:
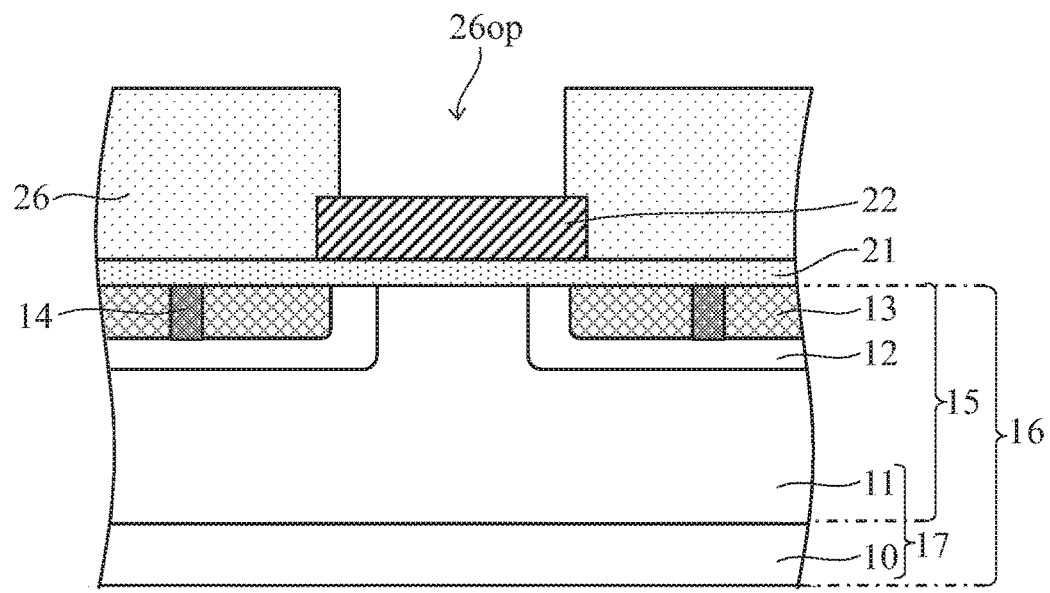
FIGS. 5A and 5B are sectional views for illustrating a method of manufacturing the vertical MOSFET in the semiconductor device according to the first embodiment of the present invention.

The front surface of the substrate 16 is further doped from its front surface with a P-type impurity using a photoresist pattern (not shown) for a mask, to form the P-type base contact region 14 as illustrated in FIG. 5A. The interlayer insulating film 26 is subsequently formed on the entire surface and, after that, a photoresist (not shown) having an opening above the gate electrode 22 is formed by photolithography. With a mask of the photoresist, the interlayer insulating film 26 is etched so as to expose a surface of the gate electrode 22. As a result, an opening 26op is formed in a portion of the interlayer insulating film 26 above the gate electrode 22. The photolithography is performed so that the opening in the photoresist is a little narrower than the width of the gate electrode 22 by taking alignment shift into account, in order to prevent the etching outside of the edge of the gate electrode 22. As a result, the interlayer insulating film 26 remains above the edge of the gate electrode 22.

Figure 5B:
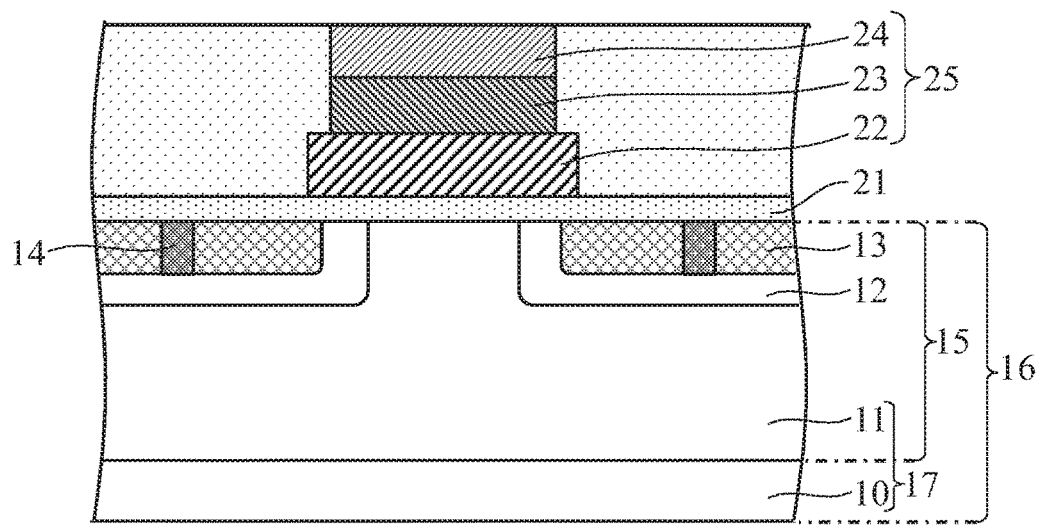

A P-type polysilicon layer is then formed on the entire surface including the inside of the opening 26op, and is etched back to leave the P-type poly silicon layer 23 only in the opening 26op above the gate electrode 22 as illustrated in FIG. 5B. An N-type polysilicon layer is subsequently formed on the entire surface including the inside of the opening 26op, and is etched back to leave the N-type polysilicon layer 24 only in the opening 26op above the P-type polysilicon layer 23. During etching back of the P-type polysilicon layer 23 and the N-type polysilicon layer 24, the gate electrode 22 (note FIG. 3) extended to the field region B is masked by the interlayer insulating film 26 and consequently remains unetched.

The contact plug 30 reaching the front surface of the substrate 16 is then formed in the interlayer insulating film 26, and the source electrode 31 is formed on the interlayer insulating film 26, to thereby electrically connect the source region 13 and the base contact region 14 in the front surface of the substrate to the N-type polysilicon layer 24 (note FIG. 2). At the same time, the contact plug 30 reaching the gate electrode 22 is formed in the interlayer insulating film 26 in the field region B to electrically connect the gate pad 33 to the gate electrode 22 as shown in FIG. 3.

Lastly, the drain electrode 32 is formed on the entire back surface of the substrate 16; the vertical MOSFET 100 in the semiconductor device according to the first embodiment which is illustrated in FIG. 2 can thereby be obtained.

Figure 6:
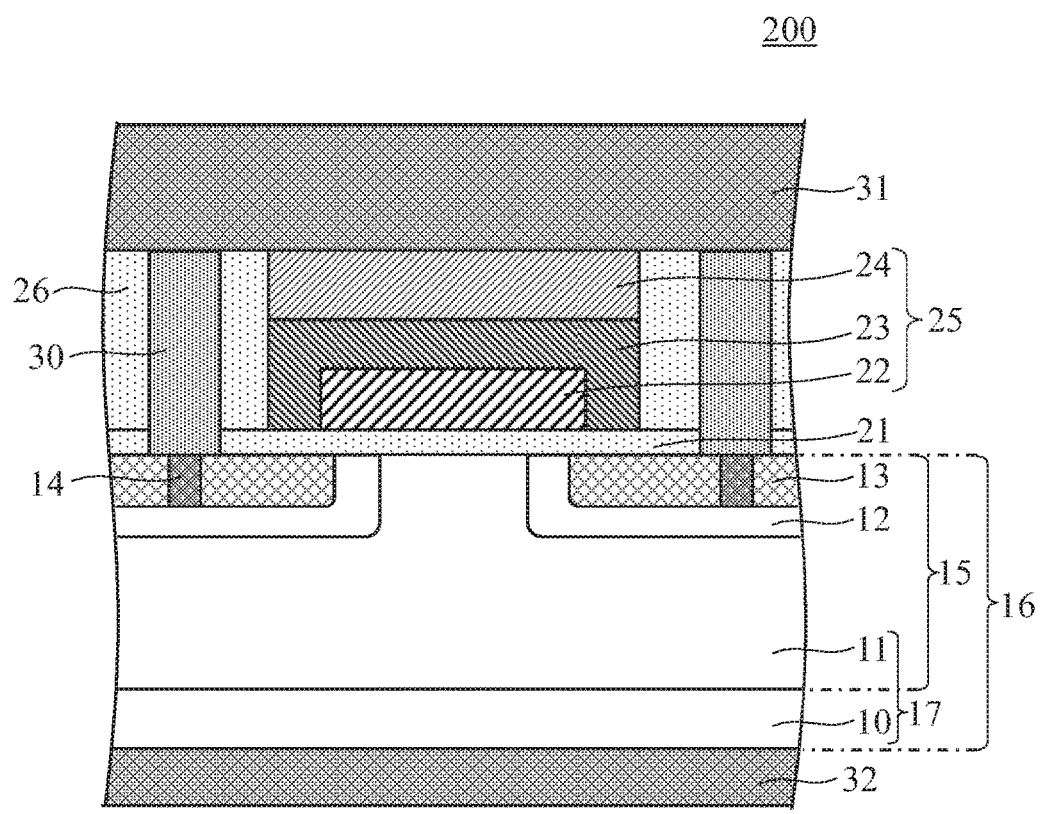
FIG. 6 is a sectional view for illustrating a method of manufacturing the vertical MOSFET in the semiconductor device according to the second embodiment of the present invention.

FIG. 6 is a sectional view for illustrating a vertical MOSFET 200 of a semiconductor device according to the second embodiment of the present invention. In the following description, the same components as those of the vertical MOSFET 100 in the semiconductor device according to the first embodiment which is illustrated in FIGS. 2 and 3 are denoted by the same reference symbols to omit duplicate descriptions as appropriate.

The structure of the bidirectional diode 25 of the vertical MOSFET 200 according to the second embodiment differs from that of the vertical MOSFET 100 according to the first embodiment.

Specifically, in the vertical MOSFET 200 according to the second embodiment, the P-type polysilicon layer 23 on the gate electrode 22 is formed so as to cover side surfaces of the gate electrode 22 as well, and the N-type polysilicon layer 24 is formed on the P-type polysilicon layer 23 to have the same width as that of the P-type polysilicon layer 23.

In the vertical MOSFET 200 according to the second embodiment, a P-N junction can have a larger area than that in the vertical MOSFET 100 according to the first embodiment, and the ESD tolerance can accordingly be improved even more.

A method of manufacturing the vertical MOSFET 200 in the semiconductor device according to the second embodiment is described next with reference to sectional views of FIGS. 7A and 7B for manufacturing steps.

The method of manufacturing the vertical MOSFET 200 according to the second embodiment is the same as the method of manufacturing the vertical MOSFET 100 according to the first embodiment which is illustrated in FIG. 4 until forming of the gate electrode 22.

Figure 7A:
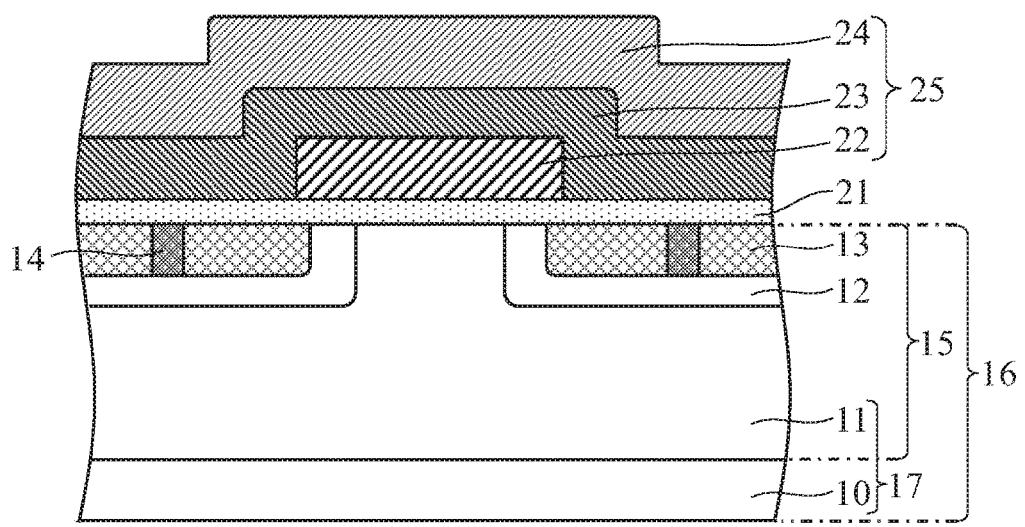
FIGS. 7A and 7B are sectional views for illustrating a method of manufacturing the vertical MOSFET in the semiconductor device according to the second embodiment of the present invention.
Figure 7B:
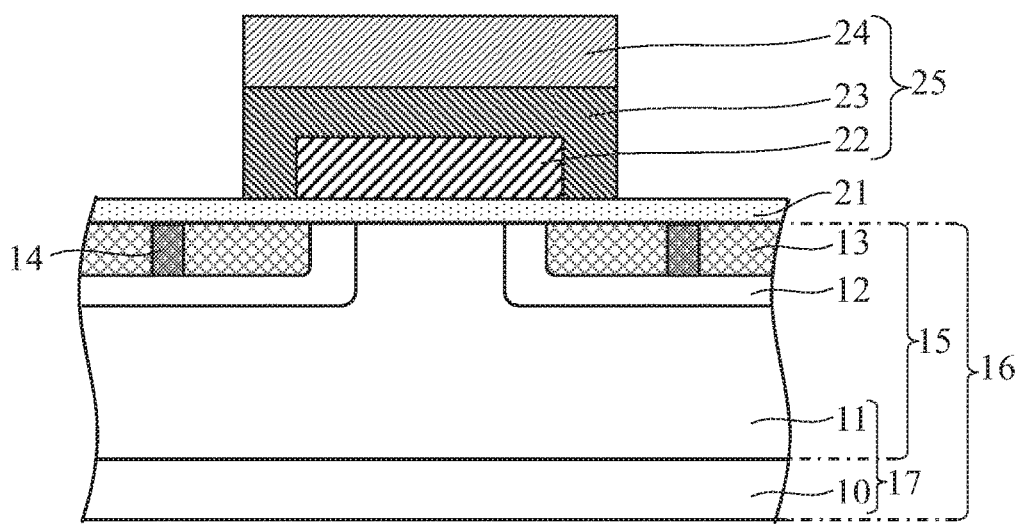

After the formation illustrated in FIG. 4, the P-type polysilicon layer 23 is formed on the entire surface, and the N-type polysilicon layer 24 is formed on the P-type polysilicon layer 23 as illustrated in FIG. 7A. A photoresist pattern (not shown) wider than the width of the gate electrode 22 is then formed above the gate electrode 22 and is used as a mask in the etching of the N-type polysilicon layer 24 and the P-type polysilicon layer 23 to obtain a structure illustrated in FIG. 7B.

Now back to FIG. 6, the interlayer insulating film 26 is next formed on the entire surface, and the contact plug 30, the source electrode 31, the drain electrode 32, and the gate pad 33 are formed in the same manner as in the first embodiment, to thereby obtain the vertical MOSFET 200 in the semiconductor device according to the second embodiment illustrated in FIG. 6.

According to the second embodiment, photolithography in which alignment shift is taken into account as in the formation of the opening 26op (see FIG. 5A) above the gate electrode 22 in the first embodiment can be eliminated, and the reliability is accordingly improved.

Figure 8:
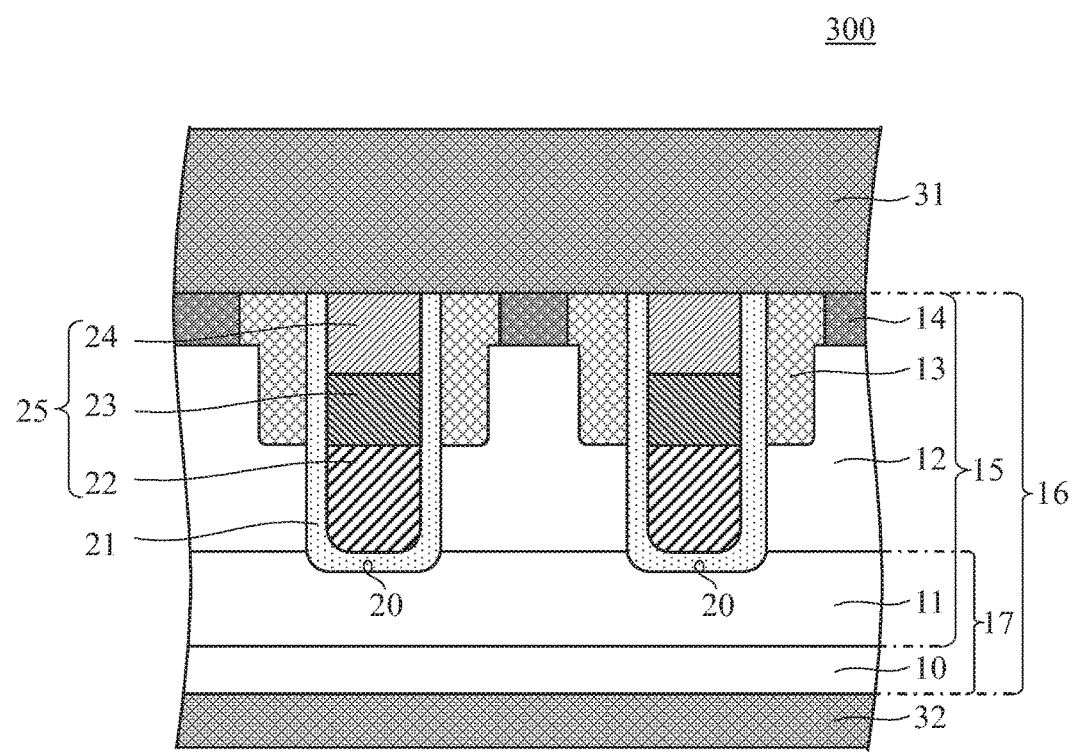
FIG. 8 is a sectional view for illustrating a method of manufacturing the vertical MOSFET in the semiconductor device according to the third embodiment of the present invention.

FIG. 8 is a sectional view for illustrating a vertical MOSFET 300 in a semiconductor device according to a third embodiment of the present invention.

The vertical MOSFET 300 according to the third embodiment is a vertical MOSFET having a trench gate structure, and differs from the vertical MOSFET 100 according to the first embodiment and the vertical MOSFET 200 according to the second embodiment in that the gate electrode 22 as well as the P-type polysilicon layer 23 and the N-type polysilicon layer 24 all of which are constituents of the bidirectional diode 25 are embedded in a trench.

In the vertical MOSFET 300 according to the third embodiment, the drain region 17, the P-type base region 12, and a trench 20 are formed in the substrate 16. The drain region 17 is constructed from the N-type heavily-doped semiconductor substrate 10 and the N-type semiconductor layer 11 formed on the N-type heavily-doped semiconductor substrate 10. The P-type base region 12 is formed on the drain region 17. The trench 20 starts from the front surface of the substrate 16 (the epitaxial layer 15), pierces the base region 12, and reaches an upper surface of the drain region 17.

The gate insulating film 21, the gate electrode 22, the P-type polysilicon layer 23, and the N-type polysilicon layer 24 are formed inside the trench 20. The gate insulating film 21 covers the bottom surface and the side surfaces of the trench 20 up to the front surface of the substrate 16. The gate electrode 22 of an N-type polysilicon layer is embedded in the trench 20 inside the gate insulating film 21 to a level lower than the front surface of the substrate 16. The P-type polysilicon layer 23 is embedded over the gate electrode 22 to a level still lower than the front surface of the substrate 16. The N-type polysilicon layer 24 fills the remaining space in the trench 20 above the P-type polysilicon layer 23. The three layers, the gate electrode 22, the P-type polysilicon layer 23, and the N-type polysilicon layer 24, form the bidirectional diode 25.

The source region 13 which is implanted with high concentration N-type impurities, and the base contact region 14 which is implanted with high concentration P-type impurities, are formed in regions on the front surface of the substrate 16 excluding the trench 20. The source region 13 has a depth along the trench 20 reaching at least the level of the upper portion of the gate electrode 22. The base contact region 14 is sandwiched between portions of the source region 13 and extends from the front surface of the substrate 16 to reach the base region 12.

The source electrode 31 is formed on the substrate 16 to have direct contact with the source region 13 and the base contact region 14, as well as the N-type polysilicon layer 24 which is the other end of the bidirectional diode 25, thereby electrically connecting the source region 13, the base contact region 14, and the N-type polysilicon layer 24 to one another. The drain electrode 32 is formed on the entire back surface of the substrate 16 in contact with the heavily-doped semiconductor substrate 10.

According to the third embodiment, the gate electrode 22, the P-type polysilicon layer 23, and the N-type polysilicon layer 24 which make the bidirectional diode 25 are thus formed in the trench 20 in the stated order in a direction perpendicular to the substrate 16, thereby enabling one of the chip size reduction and the active region expansion, and improvement of the ESD tolerance as in the first embodiment and the second embodiment.

Another advantage resides in that there is no need to take alignment shift into consideration as in the forming of the opening 26op (see FIG. 5A) above the gate electrode 22 in the first embodiment.

Figure 9:
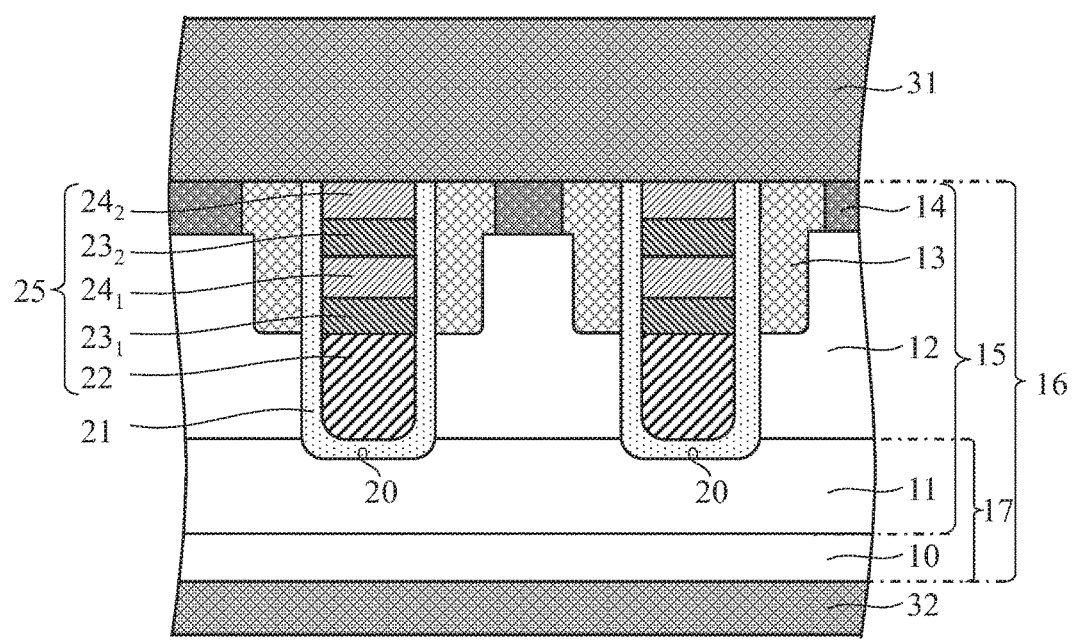
FIG. 9 is a sectional view for illustrating a method of manufacturing the vertical MOSFET in the semiconductor device according to the fourth embodiment of the present invention.

FIG. 9 is a sectional view for illustrating a vertical MOSFET 400 in a semiconductor device according to a fourth embodiment of the present invention.

The vertical MOSFET 400 according to the fourth embodiment is a vertical MOSFET having a trench gate structure as is the vertical MOSFET 300 according to the third embodiment. In the vertical MOSFET 400, however, the bidirectional diode 25 formed and embedded in the trench 20 has two more polysilicon layers than in the vertical MOSFET 300 according to the third embodiment, so that the bidirectional diode 25 is an NPNPN diode constructed from five polysilicon layers, the N-type polysilicon layer (gate electrode 22), a P-type polysilicon layer $23_1$, an N-type polysilicon layer $24_1$, a P-type polysilicon layer $23_2$, and an N-type polysilicon layer $24_2$.

In the vertical MOSFET 400 according to the fourth embodiment the breakdown voltage of the bidirectional diode 25 can be increased.

Figure 10:
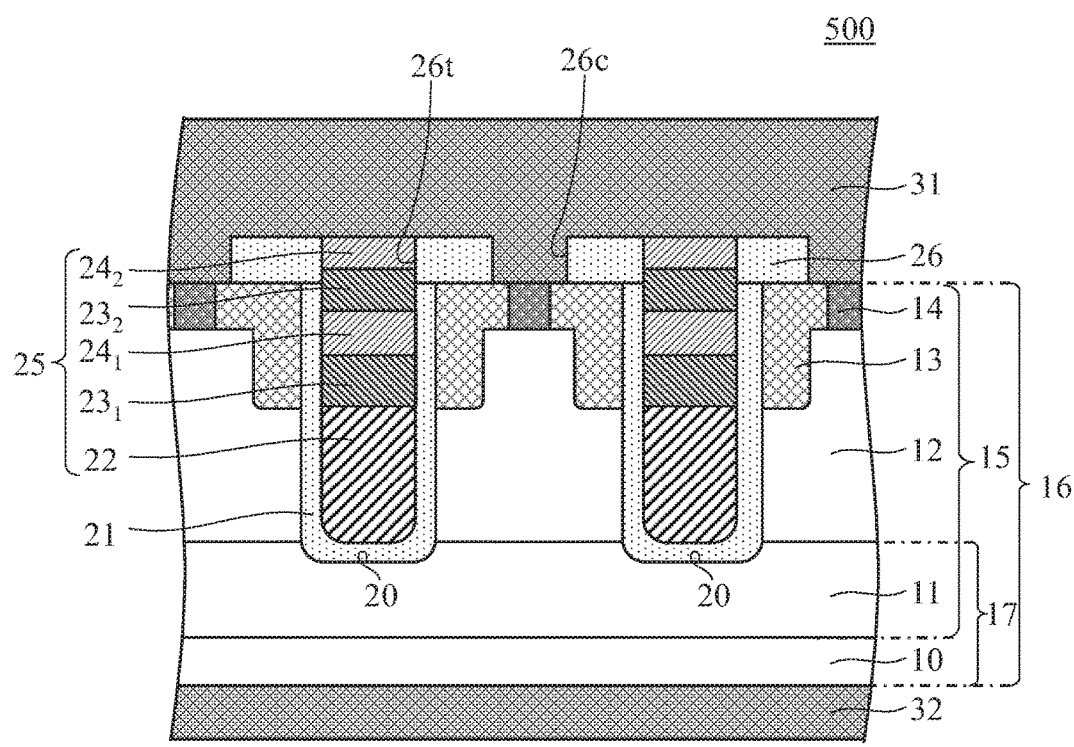
FIG. 10 is a sectional view for illustrating a method of manufacturing the vertical MOSFET in the semiconductor device according to the fifth embodiment of the present invention.

FIG. 10 is a sectional view for illustrating a vertical MOSFET 500 in a semiconductor device according to the fifth embodiment of the present invention.

The vertical MOSFET 500 according to the fifth embodiment is similar to that according to the fourth embodiment in that the bidirectional diode 25 is an NPNPN diode constructed from five polysilicon layers (the gate electrode 22, the P-type polysilicon layer $23_1$, the N-type polysilicon layer $24_1$, the P-type polysilicon layer $23_2$, and the N-type polysilicon layer $24_2$), but differs from the vertical MOSFET 400 according to the fourth embodiment in that the bidirectional diode 25 is not embedded in the trench 20 entirely and sticks out of the trench 20 to be level with the interlayer insulating film 26 which is used as a mask in the formation of the trench 20.

The bidirectional diode 25 in the vertical MOSFET 500 according to the fifth embodiment is formed as follows:

First, the interlayer insulating film 26 having an opening 26t is formed on the front surface of the substrate 16 above a region in which the trench 20 is formed later, and is used as a mask in the etching of the substrate 16 to form the trench 20. Thereby a trench constructed from the trench 20 and the opening 26t which is joined to the top portion of the trench 20 is formed. The gate insulating film 21 is then formed on the bottom portion and inner side surfaces of the trench 20. Thereafter, the gate electrode 22 of N-type polysilicon is formed at the bottom portion inside the trench constructed from the trench 20 and the opening 26t on the gate insulating film 21. The P-type polysilicon layer $23_1$, the N-type polysilicon layer $24_1$, the P-type polysilicon layer $23_2$, and the N-type polysilicon layer $24_2$ are embedded in the remaining space of the trench constructed from the trench 20 and the opening 26t above the gate electrode 22, to thereby form the bidirectional diode 25. Each of the five polysilicon layers constructing the bidirectional diode 25 is made by forming a polysilicon layer in the trench constructed from the trench 20 and the opening 26t and then etching back the polysilicon layer.

A contact hole 26c in which surfaces of the source region 13 and the base contact region 14 are exposed is formed in the interlayer insulating film 26. The source electrode 31 is formed on the entire surface including the inside of the contact hole 26c, thereby electrically connecting the N-type polysilicon layer $24_2$ which is the other end of the bidirectional diode 25 to the source region 13 and the base contact region 14.

In the vertical MOSFET 500 according to the fifth embodiment, the presence of the contact hole 26c thus creates surface irregularities on the front surface of the substrate 16, improving the contact strength between the source electrode 31 and the substrate 16 as compared to the formation of the source electrode 31 on a flat surface as in the vertical MOSFET 400 according to the fourth embodiment.

Figure 11:
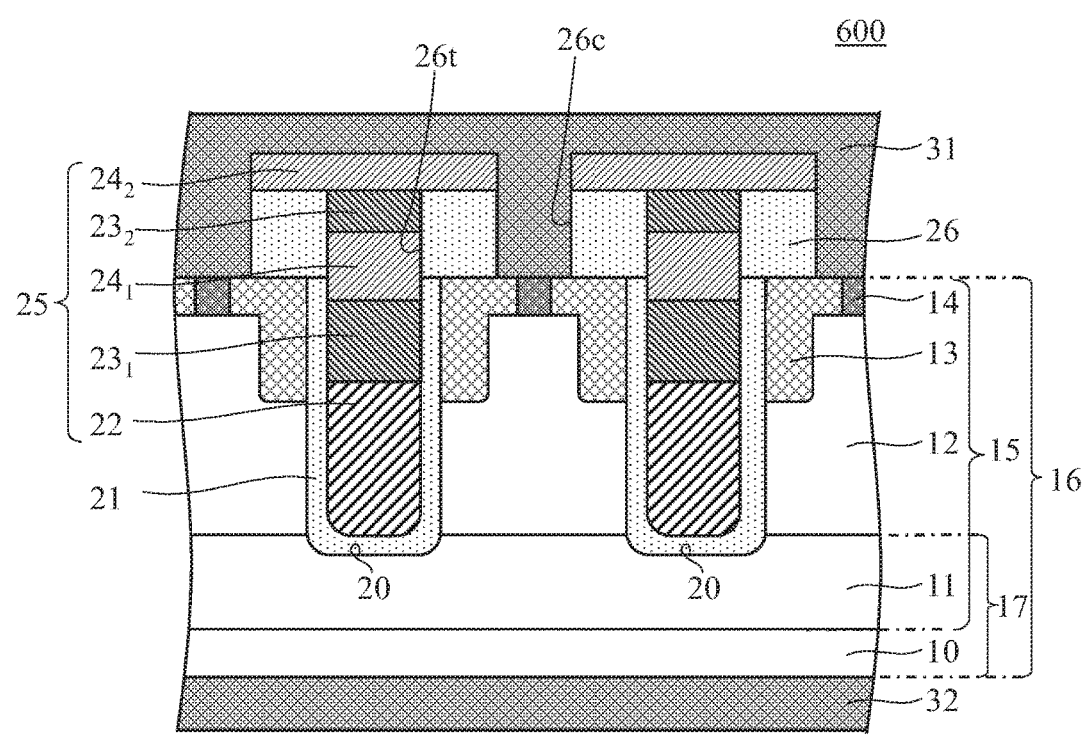
FIG. 11 is a sectional view for illustrating a method of manufacturing the vertical MOSFET in the semiconductor device according to the sixth embodiment of the present invention.

FIG. 11 is a sectional view for illustrating a vertical MOSFET 600 in a semiconductor device according to a sixth embodiment of the present invention.

The vertical MOSFET 600 according to the sixth embodiment differs from the vertical MOSFET 500 according to the fifth embodiment in that the N-type polysilicon layer $24_2$ which is the other end of the bidirectional diode 25 is formed on the interlayer insulating film 26. The source electrode 31 is formed in contact with the upper surface and side surfaces of the N-type polysilicon layer $24_2$ because of this difference.

In the vertical MOSFET 600 according to the sixth embodiment, the source electrode 31 and the N-type polysilicon layer $24_2$ are thus connected to each other in a larger area, improving the contact strength therebetween and also reducing the contact resistance.

The bidirectional diode 25 in the vertical MOSFET 600 according to the sixth embodiment which is illustrated in FIG. 11 is formed as follows:

First, a trench constructed from the trench 20 and the opening 26t joined to the top portion of the trench 20 is formed in the same manner as in the fifth embodiment. The gate insulating film 21 is formed on the bottom portion and inner side surfaces of the trench 20, and then the gate electrode 22 of N-type polysilicon is formed in the trench constructed from the trench 20 and the opening 26t on the gate insulating film 21. Next, the P-type polysilicon layer $23_1$, the N-type polysilicon layer $24_1$, and the P-type polysilicon layer $23_2$ are embedded in the remaining space of the trench constructed from the trench 20 and the opening 26t above the gate electrode 22. Each of the four polysilicon layers, the gate electrode 22, the P-type polysilicon layer $23_1$, the N-type polysilicon layer $24_1$, and the P-type polysilicon layer $23_2$, is made by forming a polysilicon layer in the trench constructed from the trench 20 and the opening 26t and then etching back the polysilicon layer.

An N-type polysilicon layer is then formed on the interlayer insulating film 26 and the P-type polysilicon layer $23_2$. A photoresist pattern (not shown) having an opening above a part of the source region 13 and the base contact region 14 is used as a mask to etch the N-type polysilicon layer and the interlayer insulating film 26. The N-type polysilicon layer $24_2$ which is the other end of the bidirectional diode 25 and also the contact hole 26c which exposes surfaces of the source region 13 and the base contact region 14 are hence formed.

The source electrode 31 is formed in the contact hole 26c and on the N-type polysilicon layer $24_2$, thereby electrically connecting the N-type polysilicon layer $24_2$ which is the other end of the bidirectional diode 25 to the source region 13 and the base contact region 14.

Figure 12:
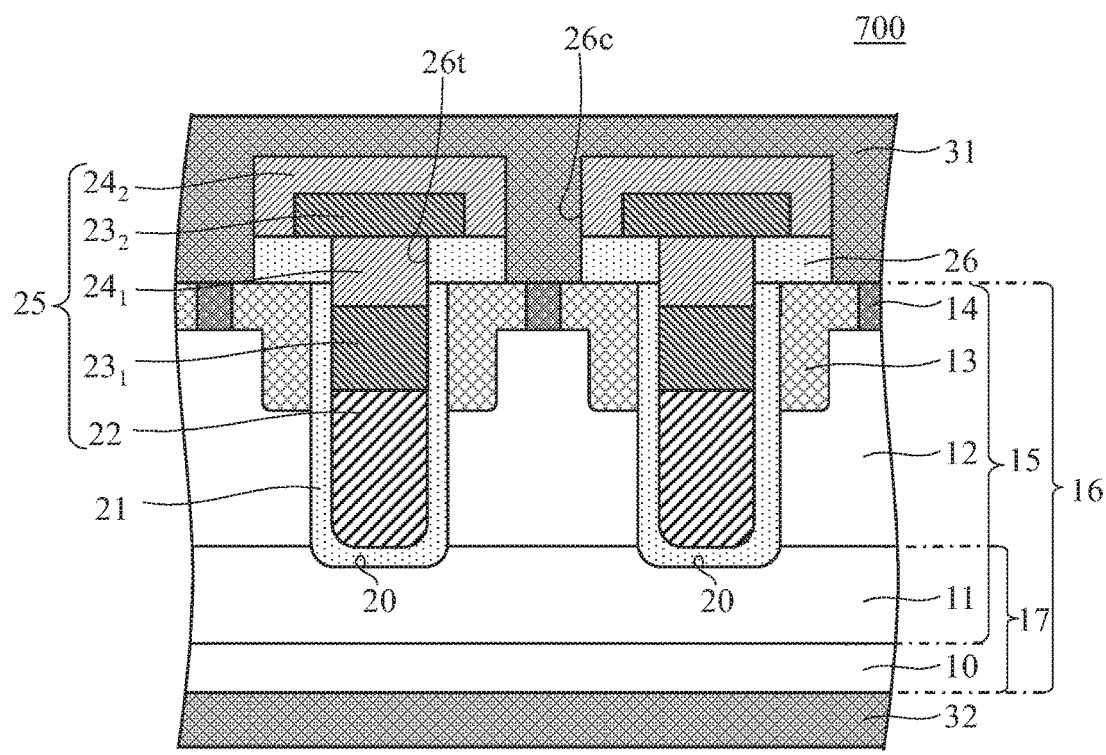
FIG. 12 is a sectional view for illustrating a method of manufacturing the vertical MOSFET in the semiconductor device according to the seventh embodiment of the present invention.
Figure 13A:
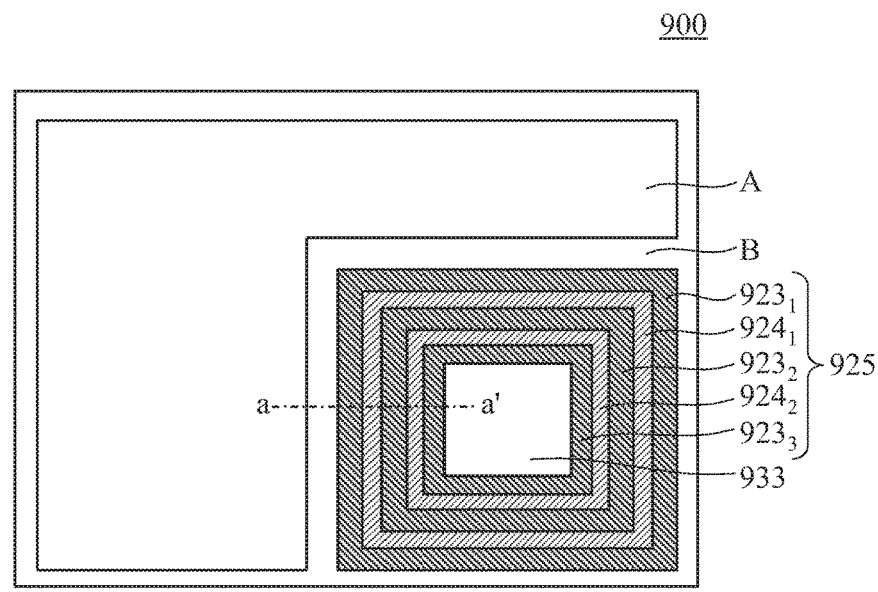
FIGS. 13A and 13B are a plan view and a sectional view, respectively, for illustrating the structure of a conventional semiconductor device having a vertical MOSFET and an ESD protection diode.
Figure 13B:
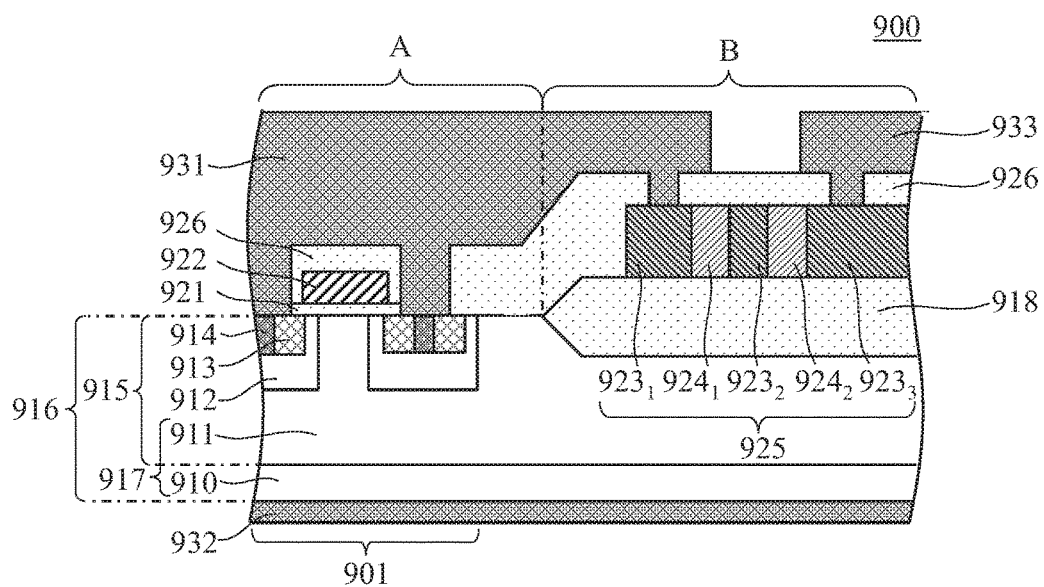

FIG. 12 is a sectional view for illustrating a vertical MOSFET 700 in a semiconductor device according to a seventh embodiment of the present invention.

The vertical MOSFET 700 according to the seventh embodiment differs from the vertical MOSFET 600 according to the sixth embodiment in that the P-type polysilicon layer $23_2$ as well as the N-type polysilicon layer $24_2$ which is the other end of the bidirectional diode 25 is formed on the interlayer insulating film 26.

Specifically, the P-type polysilicon layer $23_2$ is formed on the N-type polysilicon layer $24_1$ and a part of the interlayer insulating film 26, and the N-type polysilicon layer $24_2$ is formed on the P-type polysilicon layer $23_2$ and on the remainder of the interlayer insulating film 26. In short, the N-type polysilicon layer $24_2$ is formed in contact with the upper surface and side surfaces of the P-type polysilicon layer $23_2$.

In the vertical MOSFET 700 according to the seventh embodiment, the source electrode 31 and the N-type polysilicon layer $24_2$ are thus connected to each other in a larger area than in the vertical MOSFET 600 according to the sixth embodiment, improving the contact strength therebetween even more and reducing the contact resistance even less.

The bidirectional diode 25 in the vertical MOSFET 700 according to the seventh embodiment which is illustrated in FIG. 12 is formed as follows:

First, a trench constructed from the trench 20 and the opening 26t joined to the top portion of the trench 20 is formed in the same manner as in the fifth embodiment and the sixth embodiment. The gate insulating film 21 is formed on the bottom portion and inner side surfaces of the trench 20, and then the gate electrode 22 of N-type polysilicon is formed in the trench constructed from the trench 20 and the opening 26t on the gate insulating film 21. Next, the P-type polysilicon layer $23_1$ and the N-type polysilicon layer $24_1$ are embedded in the remaining space of the trench constructed from the trench 20 and the opening 26t above the gate electrode 22. Each of the gate electrode 22, the P-type polysilicon layer $23_1$, and the N-type polysilicon layer $24_1$ is made by forming a polysilicon layer in the trench constructed from the trench 20 and the opening 26t and then etching back the polysilicon layer.

A P-type polysilicon layer is then formed on the interlayer insulating film 26 and the N-type polysilicon layer $24_1$. A photoresist pattern (not shown) covering the N-type polysilicon layer $24_1$ and a part of the top of the interlayer insulating film 26 is used as a mask in the etching of the P-type polysilicon layer to form the P-type polysilicon layer $23_2$.

Next, an N-type polysilicon layer is formed so as to cover the side surfaces and upper surface of the P-type polysilicon layer $23_2$ and the interlayer insulating film 26. A photoresist pattern (not shown) having an opening above a part of the source region 13 and above the base contact region 14 is used as a mask to etch the N-type polysilicon layer and the interlayer insulating film 26. The N-type polysilicon layer $24_2$ which is the other end of the bidirectional diode 25 and the contact hole 26c which exposes surfaces of the source region 13 and the base contact region 14 are hence formed.

The source electrode 31 is formed in the contact hole 26c and on the N-type polysilicon layer $24_2$, to thereby electrically connect the N-type polysilicon layer $24_2$ being the other end of the bidirectional diode 25 to the source region 13 and the base contact region 14.

It is apparent that the present invention is not limited to the above embodiments, but may be modified and changed without departing from the scope and spirit of the invention.

For instance, the conductivity types of P-type components and N-type components may all be reversed in the semiconductor device configurations described in the embodiments.

The number of layers of the bidirectional diode 25 is not limited to the three layers and five layers described above, and can be increased further.

What is claimed is:

1. A semiconductor device, comprising:
   a substrate;
   a drain region and a source region of a first conductivity type in the substrate;
   a base region of a second conductivity type between the drain region and the source region;
   a gate electrode comprising a first polysilicon layer of the first conductivity type, and being in contact with the base region across a gate insulating film therebetween;
   a bidirectional diode including the gate electrode, a second polysilicon layer of the second conductivity type on the gate electrode, and a third polysilicon layer of the first conductivity type on the second polysilicon layer, and being configured so that the gate electrode serves as one end, the gate electrode, the second polysilicon layer, and the third polysilicon layer being arranged in the stated order in a direction perpendicular to a front surface of the substrate;
   a source electrode electrically connected to the source region, the base region, and another end of the bidirectional diode; and
   a drain electrode on a back surface of the substrate in contact with the drain region.

2. The semiconductor device according to claim 1, wherein the bidirectional diode is above the substrate across the gate insulating film.

3. The semiconductor device according to claim 1:
   wherein the drain region in the substrate has a given thickness from the back surface of the substrate; and
   further comprising a trench extending from the front surface of the substrate to an upper surface of the drain region,
   the gate insulating film covering a bottom surface and side surfaces inside the trench, and
   the gate electrode being embedded inside the trench on the gate insulating film.

4. The semiconductor device according to claim 3, wherein the second polysilicon layer is embedded inside the trench on the gate insulating film.

5. The semiconductor device according to claim 4, wherein the third polysilicon layer is embedded inside the trench on the gate insulating film.

6. The semiconductor device according to claim 5:
   the bidirectional diode further comprising, on the third polysilicon layer, a fourth polysilicon layer having the second conductivity type and a fifth polysilicon layer having the first conductivity type; and
   wherein the fourth polysilicon layer and the fifth polysilicon layer are arranged in the stated order in the direction perpendicular to the substrate.

7. The semiconductor device according to claim 6, wherein the fourth polysilicon layer is embedded inside the trench on the gate insulating film.

8. The semiconductor device according to claim 7, wherein the fifth polysilicon layer is embedded inside the trench on the gate insulating film.

* * * * *